(12) United States Patent
Kim et al.

(10) Patent No.: US 7,236,220 B2
(45) Date of Patent: Jun. 26, 2007

(54) LIQUID CRYSTAL DISPLAY DEVICE AND MANUFACTURING METHOD THEREOF

(75) Inventors: Se-June Kim, Seoul (KR); Seung-Ryul Park, Incheon (KR); Dong-Guk Kim, Seoul (KR)

(73) Assignee: LG.Philips LCD Co., Ltd., Seoul (KR)

( * ) Notice: Subject to any disclaimer, the term of this patent is extended or adjusted under 35 U.S.C. 154(b) by 393 days.

(21) Appl. No.: 11/019,629

(22) Filed: Dec. 23, 2004

(65) Prior Publication Data

US 2005/0139922 A1 Jun. 30, 2005

(30) Foreign Application Priority Data

Dec. 27, 2003 (KR) ............... 10-2003-0098130

(51) Int. Cl.
*G02F 1/1335* (2006.01)
*G02F 1/136* (2006.01)

(52) U.S. Cl. .......................... 349/106; 349/43
(58) Field of Classification Search ............... 349/106, 349/44, 43, 110, 111
See application file for complete search history.

(56) References Cited

U.S. PATENT DOCUMENTS

| | | | | |
|---|---|---|---|---|
| 5,818,550 A | * | 10/1998 | Kadota et al. | 349/43 |
| 5,943,107 A | * | 8/1999 | Kadota et al. | 349/44 |
| 5,976,734 A | * | 11/1999 | Yamaguchi | 430/7 |
| 6,031,512 A | * | 2/2000 | Kadota et al. | 345/88 |
| 6,429,916 B1 | * | 8/2002 | Nakata et al. | 349/106 |
| 6,466,281 B1 | * | 10/2002 | Huang et al. | 349/44 |
| 6,515,300 B2 | * | 2/2003 | den Boer et al. | 257/59 |
| 6,556,271 B1 | * | 4/2003 | Tsujimura et al. | 349/187 |
| 6,577,374 B1 | * | 6/2003 | Nakata et al. | 349/156 |
| 6,873,382 B2 | * | 3/2005 | Chang et al. | 349/106 |
| 6,900,856 B2 | * | 5/2005 | Kim et al. | 349/44 |
| 7,075,110 B2 | * | 7/2006 | Kim | 257/72 |
| 7,190,419 B2 | * | 3/2007 | Park | 349/43 |

\* cited by examiner

*Primary Examiner*—James A. Dudek
(74) *Attorney, Agent, or Firm*—McKenna Long & Aldridge LLP

(57) ABSTRACT

A manufacturing method of a liquid crystal display device is provided. The method includes forming a gate line and a data line on a substrate; forming a thin film transistor connected to the gate and data lines, the thin film transistor including a gate electrode, a semiconductor layer, a source electrode and a drain electrode; forming a black matrix over the thin film transistor, the black matrix having an opening; forming a first conductive layer on a substrate having the black matrix such that the first conductive layer contacts a portion of the drain electrode; forming a color filter layer on the first conductive layer at a portion corresponding to the opening of the black matrix; partially etching a surface of the first conductive layer corresponding to the black matrix; forming a second conductive layer on the color filter layer such that the second conductive layer contacts the partially etched first conductive layer; and forming a pixel electrode by patterning the first and second conductive layers.

16 Claims, 17 Drawing Sheets

LIQUID CRYSTAL DISPLAY DEVICE AND MANUFACTURING METHOD THEREOF

This application claims the benefit of Korean Patent Application No. 2003-0098130 filed in Korea on Dec. 27, 2003, which is hereby incorporated by reference.

BACKGROUND OF THE INVENTION

1. Field of the Invention

The present invention relates to a liquid crystal display device, and more particularly, to a liquid crystal display device having a color filter layer on an array substrate and a manufacturing method thereof.

2. Discussion of the Related Art

A liquid crystal display (LCD) device is driven based on the optical anisotropy and polarization characteristics of a liquid crystal material. In general, the LCD device includes two substrates spaced apart and facing each other with a liquid crystal material layer interposed between the two substrates. Each of the substrates includes electrodes facing each other such that a voltage applied to each electrode induces an electric field between the electrodes perpendicular to the substrates. An alignment of liquid crystal molecules of the liquid crystal material layer changes by varying an intensity or direction of the applied electric field. Accordingly, the LCD device displays an image by varying light transmittance through the liquid crystal material layer in accordance with the arrangement of the liquid crystal molecules.

FIG. 1 is an expanded perspective view illustrating a related art LCD device. As shown in FIG. 1, the LCD device 11 includes an upper substrate 5, referred to as a color filter substrate, and a lower substrate 22, referred to as an array substrate, having a liquid crystal material layer 14 interposed therebetween. On the upper substrate 5, a black matrix 6, and a color filter layer 8 are formed in a shape of an array matrix including a plurality of red (R), green (G), and blue (B) color filters surrounded by corresponding portions of the black matrix 6. Additionally, a common electrode 18 is formed on the upper substrate 5 to cover the color filter layer 8 and the black matrix 6.

On the lower substrate 22, a plurality of thin film transistors (TFTs) T are formed as an array matrix corresponding to the color filter layer 8. A plurality of crossing gate lines 13 perpendicularly cross a plurality of data lines 15. The TFTs T are positioned such that each TFT T is located adjacent to an intersection of one of the gate lines 13 and one of the data lines 15. Furthermore, a plurality of pixel electrodes 17 are formed on a pixel region P defined between the gate lines 13 and the data lines 15 of the lower substrate 22. The pixel electrode 17 includes a transparent conductive material having high transmittance, such as indium-tin-oxide (ITO) or indium-zinc-oxide (IZO).

As further shown in FIG. 1, a storage capacitor $C_{ST}$ is disposed in each pixel P and connected in parallel to the pixel electrode 17 of the pixel. The storage capacitor $C_{ST}$ is comprised of a portion of the gate line 13 as a first capacitor electrode and a metal layer 30 as a second capacitor electrode. Since the metal layer 30 is connected to the pixel electrode 17 through a contact hole, the storage capacitor $C_{ST}$ is electrically contacted to the pixel electrode 17. The metal layer 30 may be made of the same material as the data line 15. When fabricating the LCD device 11 of FIG. 1, the upper substrate 5 is aligned with and attached to the lower substrate 22. In this process, the upper substrate 5 may be misaligned with the lower substrate 22 and light leakage may occur in the completed LCD device 11 due to an error margin in attaching the upper and lower substrate 5 and 22.

FIG. 2 is a cross-sectional view along line II-II of FIG. 1 illustrating a pixel of the related art liquid crystal display (LCD) device. As shown in FIG. 2, the related art LCD device includes the upper substrate 5, the lower substrate 22, and the liquid crystal layer 14. The upper and lower substrates 5 and 22 are spaced apart from each other, and the liquid crystal layer 14 is interposed therebetween. The upper and lower substrates 5 and 22 are often referred to as an array substrate and a color filter substrate, respectively, because the color filter layer 8 is formed upon the upper substrate and a plurality of array elements are formed on the lower substrate 22. As further shown in FIG. 2, the thin film transistor T is formed on an inner surface of the lower substrate 22, and a passivation layer 40 is formed on the thin film transistor T. The thin film transistor T includes a gate electrode 32, an active layer 34, a source electrode 36, and a drain electrode 38.

Referring to FIG. 1, the gate electrode 32 extends from the gate line 13 and the source electrode 36 extends from the data line 15. The gate, source, and drain electrodes 32, 36, and 38 are formed of a metallic material while the active layer 34 is formed of silicon. The pixel electrode 17, formed of a transparent conducting material, is disposed in the pixel region P.

As shown in FIG. 2, the pixel electrode 17 contacts the drain electrode 38 and the metal layer 30. As mentioned above, the gate electrode 13 acts as a first electrode of the storage capacitor $C_{ST}$ and the metal layer 30 acts as a second electrode of the storage capacitor $C_{ST}$. Thus, the gate electrode 13 and the metal layer 30 define the storage capacitor $C_{ST}$.

Still referring to FIG. 2, the upper substrate 5 is spaced apart from the first substrate 22 over the thin film transistor T. On the rear surface of the upper substrate 5, a black matrix 6 is disposed in the position corresponding to the thin film transistor T and the gate line 13. The black matrix 6 is formed on the entire surface of the upper substrate 5 and has openings corresponding to the pixel electrode 17 of the lower substrate 11, as shown in FIG. 1. The black matrix 6 prevents light leakage in the LCD panel except for the portion for the pixel electrode 17. The black matrix 6 protects the thin film transistor T from the light such that the black matrix 6 prevents generating of photo current in the thin film transistor T. The color filter layer 8 is formed on the rear surface of the upper substrate 5 to cover the black matrix 6. Each of the color filters 8 has one of the red, green, and blue colors and corresponds to one pixel region where the pixel electrode 17 is located. A common electrode 18 formed of a transparent conductive material is disposed on the color filter layer 8 over the upper substrate 5.

In the related art LCD panel mentioned above, each pixel electrode 17 corresponds to each color filter. Furthermore, to prevent cross-talk between the pixel electrode 17 and the gate and data lines 13 and 15, the pixel electrode 17 is spaced apart from the data line 15 by a distance A and from the gate line 13 by a distance C, as shown in FIG. 2. The open spaces A and C between the pixel electrode 17 and the data and gate lines 15 and 13 cause a malfunction, such as light leakage in the LCD device. Typically, light leakage primarily occurs in the open spaces A and C. However, the black matrix 6 formed on the upper substrate 5 should cover the open spaces A and C. However, when arranging the upper substrate 5 with the lower substrate 22 or vice versa, a misalignment may occur between the upper substrate 5 and the lower substrate 22. Therefore, the black matrix 6 is extended to be sure that the black matrix still covers the open spaces A and C. That is, the black matrix 6 is designed to provide an aligning margin to prevent light leakage. However, by extending the black matrix, an aperture ratio of the liquid crystal panel is reduced in as much as the aligning margin of the black matrix 6 is increased. Moreover, if there are errors in the aligning margin of the black matrix 6, light leakage occurs in the open spaces A and C, thereby deteriorating the image quality of the LCD device.

SUMMARY OF THE INVENTION

Accordingly, the present invention is directed to a liquid crystal display (LCD) device having a color filter layer on an array substrate and a manufacturing method thereof that substantially obviates one or more of the problems due to limitations and disadvantages of the related art.

An object of the present invention is to provide a liquid crystal display device that has a high aperture ratio.

Another object of the present invention is to provide a manufacturing method of a liquid crystal display device that improves contact between first and second conductive layers to prevent damage of the first and second conductive layers and a color filter layer.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described a manufacturing method of a liquid crystal display device comprises forming a gate line and a data line on a substrate; forming a thin film transistor connected to the gate and data lines, the thin film transistor including a gate electrode, a semiconductor layer, a source electrode and a drain electrode; forming a black matrix over the thin film transistor, the black matrix having an opening; forming a first conductive layer on a substrate having the black matrix such that the first conductive layer contacts a portion of the drain electrode; forming a color filter layer on the first conductive layer at a portion corresponding to the opening of the black matrix; partially etching a surface of the first conductive layer corresponding to the black matrix; forming a second conductive layer on the color filter layer such that the second conductive layer contacts the partially etched first conductive layer; and forming a pixel electrode by patterning the first and second conductive layers.

In another aspect, a manufacturing method of a liquid crystal display device comprises forming a gate line and a gate electrode on a substrate; forming a gate insulating layer on the gate line and the gate electrode; forming a semiconductor layer on the gate insulating layer over the gate electrode; forming a data line, a source electrode and a drain electrode, the data line crossing the gate line to define a pixel area, and the source and drain electrodes being disposed over the semiconductor layer and being spaced apart from each other, and the gate electrode, the semiconductor layer, the source electrode, and the drain electrodes form a thin film transistor; forming a first passivation layer covering the thin film transistor; forming a black matrix on the first passivation layer, the black matrix having a first opening corresponding to the pixel area and the first opening exposes the first passivation layer on a portion of the drain electrode; forming a second passivation layer on a surface of the substrate having the black matrix; forming a second opening by patterning the second passivation layer, the first passivation layer, and the gate insulating layer such that the second opening exposes a portion of the drain electrode; forming a first conductive layer on the second passivation layer such that the first conductive layer contacts a portion of the drain electrode; forming a color filter layer on the first conductive layer in the second opening; partially etching a surface of the first conductive layer over the black matrix; forming a second conductive layer on the color filter layer such that the second conductive layer contacts the partially etched the first conductive layer; and forming a pixel electrode by patterning the first and second conductive layers, the pixel electrode being disposed in the pixel area.

In another aspect, a liquid crystal display device comprises a substrate; a gate line and a data line disposed on the substrate crossing each other to define a pixel area; a thin film transistor disposed near the crossing of the gate line and the data line, the thin film transistor having a gate electrode, a semiconductor layer, a source electrode and a drain electrode; a black matrix disposed on the thin film transistor and having an opening; a first pixel electrode disposed on the black matrix and in the pixel area, the first pixel electrode contacting a portion of the drain electrode; a color filter layer disposed on the first pixel electrode in the pixel area; and a second pixel electrode on the color filter layer contacting the first pixel electrode, a portion of the first pixel electrode contacting the second pixel electrode being thinner than a portion of the first pixel electrode under the color filter layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention.

DETAILED DESCRIPTION OF THE PREFERRED EMBODIMENTS

Reference will now be made in detail to the preferred embodiments of the present invention, examples of which are illustrated in the accompanying drawings.

Figure 1:
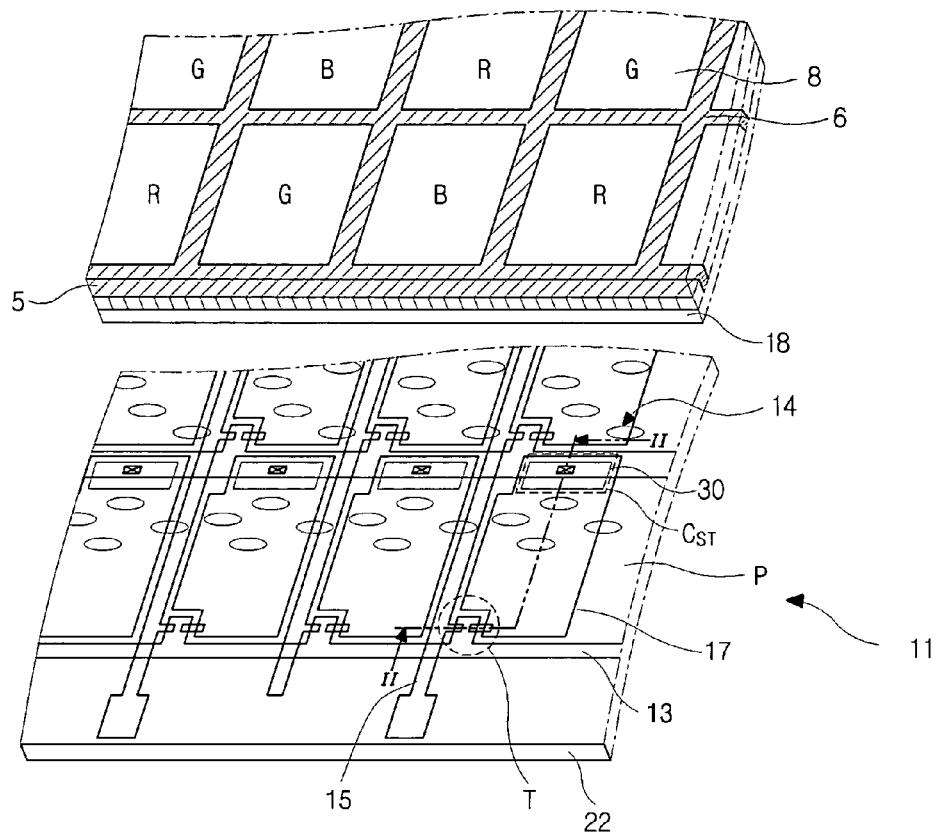
FIG. 1 is an expanded perspective view illustrating a related art liquid crystal display device.
Figure 2:
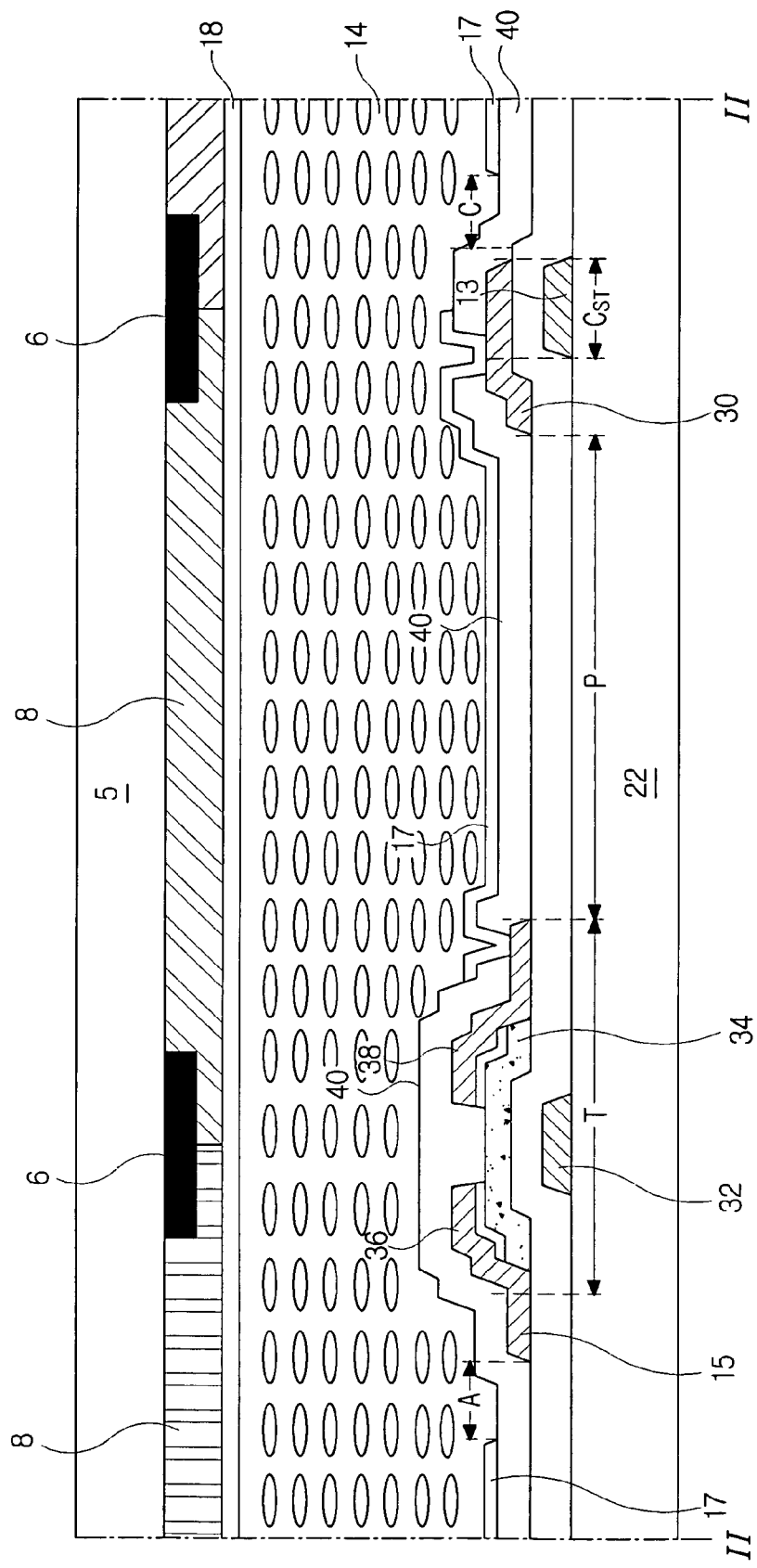
FIG. 2 is a cross-sectional view along line II-II of FIG. 1 illustrating a pixel of the related art liquid crystal display device.
Figure 3:
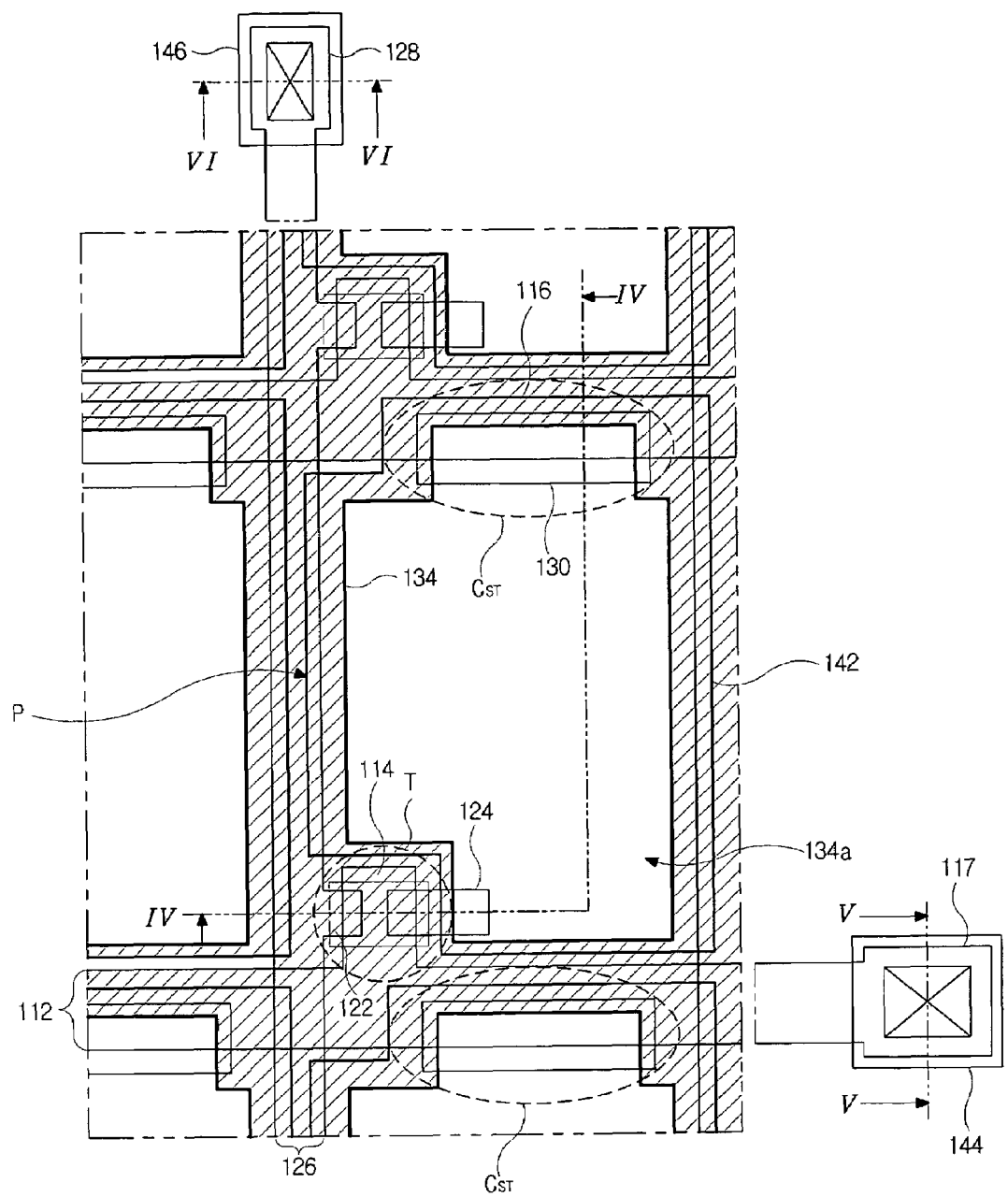
FIG. 3 is a schematic plane view of a liquid crystal display device according to an exemplary embodiment of the present invention.

FIG. 3 is a schematic plane view of a liquid crystal display device according to an embodiment of the present invention, and more particularly, illustrates an array substrate having a color filter on thin film transistor (COT) structure. As shown in FIG. 3, a gate line 112 is formed in a first direction and a data line 126 is formed in a second direction crossing the first direction. The gate line 112 and the data line 126 cross each other to define a pixel area P therebetween. A gate pad 117 is formed at one end of the gate line 112 and a data pad 128 is formed at one end of the data line 126.

A thin film transistor T is formed as a switching element adjacent to where the gate and data lines 112 and 126 cross each other. The thin film transistor T includes a gate electrode 114 that is connected to the gate line 112 for receiving scanning signals, a source electrode 122 that is connected to the data line 126 for receiving data signals, and a drain electrode 124 that is spaced apart from the source electrode 122. The drain electrode 124 can be connected to the pixel electrode 142.

A pixel electrode 142 can also be formed in the pixel area P. The pixel electrode 142 overlaps a portion of the gate line 112 so that the portion of the gate line 112 overlapping the pixel electrode 142 becomes a first capacitor electrode 116. A second capacitor electrode 130 that can be made of the same material as the data line 126 is formed over the first capacitor electrode 116, and is electrically connected to the pixel electrode 142. The first and second capacitor electrodes 116 and 130 form a storage capacitor $C_{ST}$.

A black matrix 134, which is denoted by a hatched region in FIG. 3, is formed corresponding to the gate line 112, the data line 126, the thin film transistor T and edges of the pixel electrode 142. The black matrix 134 has an opening 134a corresponding to the pixel region P. The opening 134a exposes portions of the second capacitor electrode 130 and the drain electrode 124. Thus, the pixel electrode 142 can directly contact the drain electrode 124 and the second capacitor electrode 130 without contact holes. A gate pad terminal 144 and a data pad terminal 146 are formed on the gate pad 117 and the data pad 128, respectively. The gate pad terminal 144 and the data pad terminal 146 may be made of the same material as the pixel electrode 142. Although not shown in FIG. 3, a color filter layer is formed corresponding the opening 134a of the black matrix 134.

Here, the LCD device includes an array substrate having a color filter on thin film transistor (COT) structure. In the COT structure, since the black matrix 134 and the color filter layer are formed on the same substrate with the pixel electrode 142, an alignment margin between the black matrix 134 and the pixel electrode 142 is minimized. Hereinafter, manufacturing processes of the array substrate for the LCD of the COT structure will be explained in detail with reference to FIGS. 4A to 4I, FIGS. 5A to 5I, and FIGS. 6A to 6I.

FIGS. 4A to 4I, FIGS. 5A to 5I, and FIGS. 6A to 6I are cross-sectional views illustrating process steps of manufacturing an array substrate according to a first exemplary embodiment of the present invention. FIGS. 4A to 4I correspond to cross-sections along the line IV-IV of FIG. 3, FIGS. 5A to 5I correspond to cross-sections along line V-V of FIG. 3, and FIGS. 6A to 6I correspond to cross-sections along line VI-VI of FIG. 3.

Figure 4A:
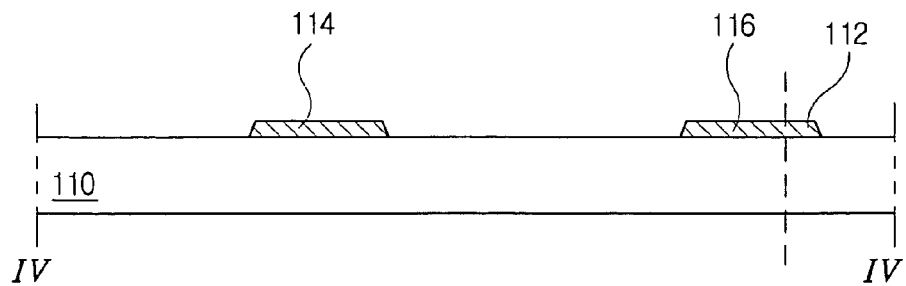
FIGS. 4A to 4I are cross-sectional views along line IV-IV of FIG. 3 illustrating process steps of manufacturing an array substrate according to a first exemplary embodiment of the present invention.
Figure 5A:
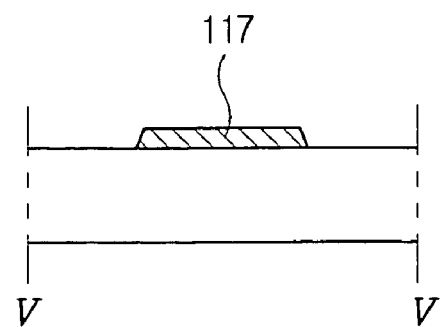
FIGS. 5A to 5I are cross-sectional views along line V-V of FIG. 3 illustrating process steps of manufacturing an array substrate according to the first exemplary embodiment of the present invention.
Figure 6A:
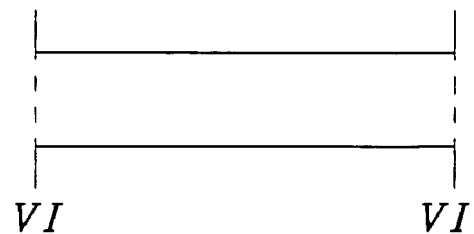
FIGS. 6A to 6I are cross-sectional views along line VI-VI of FIG. 3 illustrating process steps of manufacturing an array substrate according to the first exemplary embodiment of the present invention.

Referring to FIGS. 4A, 5A and 6A, a gate electrode 114, a gate line 112 and a gate pad 117 are formed on a substrate 110 by depositing a first metal material and then patterning the metal through a mask process, such as a photolithography process including the steps of light-exposing and developing a photosensitive material. A portion of the gate line 112 functions as a first capacitor electrode 116. The gate electrode 114 extends from the gate line 112 while the gate pad 117 is situated at one end of the gate line 112.

Figure 4B:
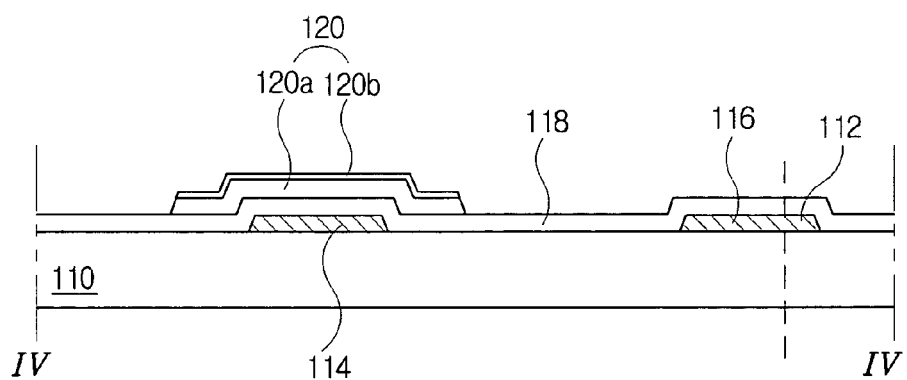
Figure 5B:
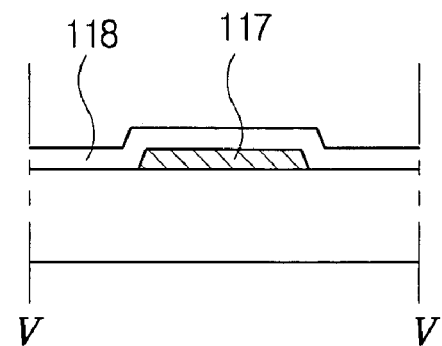
Figure 6B:
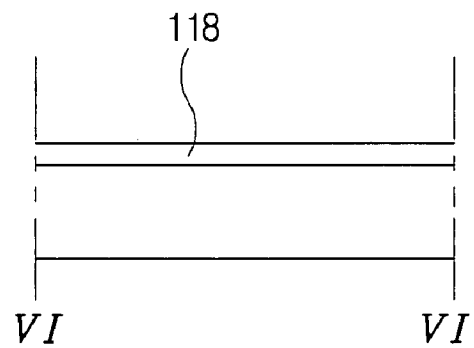

Referring to FIGS. 4B, 5B and 6B, a gate insulating layer 118, an active layer 120a and an ohmic contact layer 120b are formed by subsequently depositing a first insulating material, amorphous silicon and doped amorphous silicon over the substrate 110 having the gate line 112, the gate electrode 114 and the gate pad 110 thereon. The doped amorphous silicon and the amorphous silicon are patterned through a mask process. The active layer 120a and the ohmic contact layer 120b are disposed over the gate electrode 114 to define a semiconductor layer 120.

Figure 4C:
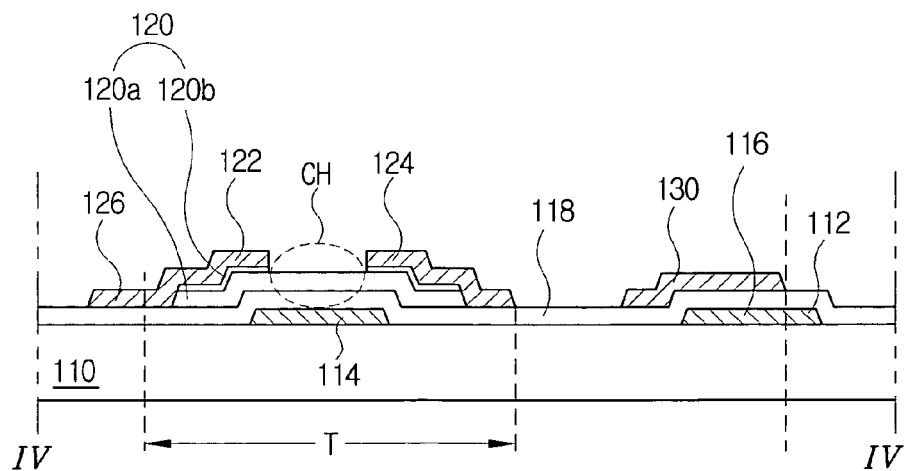
Figure 5C:
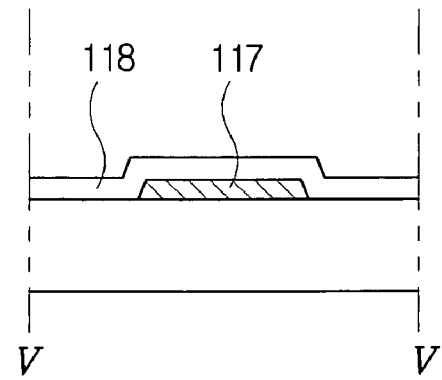
Figure 6C:
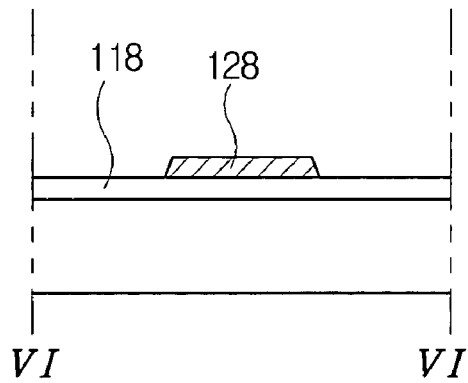

Referring to FIGS. 4C, 5C and 6C, a source electrode 122, a drain electrode 124, a data line 126 are formed by depositing a second metal material and patterning the metal through a mask process. The source and drain electrodes 122 and 124 are disposed over the semiconductor layer 120 and spaced apart from each other. The data line 126 is connected to the source electrode 122 and crosses the gate line 112. At the same time, a data pad 128 and a second capacitor electrode 130 are formed on the gate insulating layer 118. The data pad 128 is situated at one end of the data line 126. The second capacitor electrode 130 of an island shape is disposed over the first capacitor electrode 116. The gate electrode 114, the semiconductor layer 120, the source electrode 122 and the drain electrode 125 form a thin film transistor T. The gate pad 117 and the data pad 128 are disposed in a non-image area where images are not displayed.

Next, a portion of the ohmic contact layer 120b exposed between the source electrode 122 and the drain electrode 124 is removed using the source and drain electrodes 122 and 124 as an etch mask to expose a portion of the active layer 120a. The portion of the active layer 120a exposed between the source electrode 122 and the drain electrode 124 becomes a channel CH of the thin film transistor T.

Figure 4D:
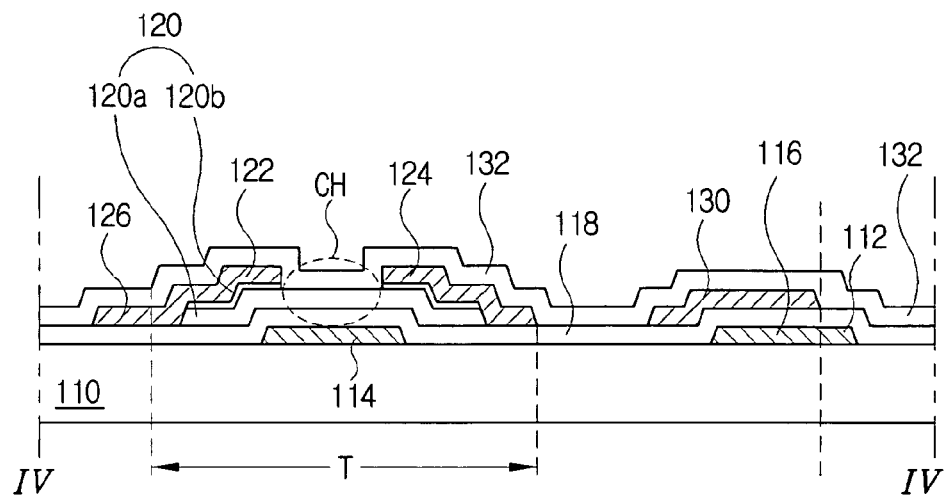
Figure 5D:
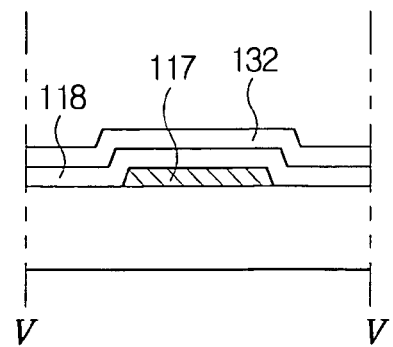
Figure 6D:
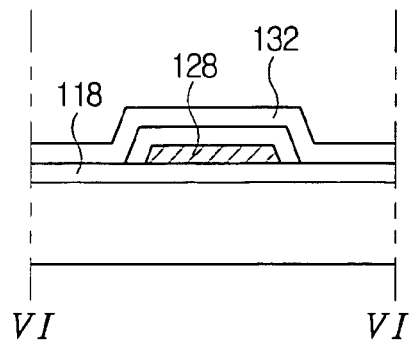

Referring to FIGS. 4D, 5D and 6D, a first passivation layer 132 is formed on the source and drain electrodes 122 and 124, the data line 126 and the second capacitor electrode 130 using a second insulating material. The first passivation layer 132 prevents poor contacts, which may occur between the thin film transistor T and a black matrix, to be formed later. The first passivation layer 132 can be made of an inorganic material, such as silicon nitride (SiNx).

Figure 4E:
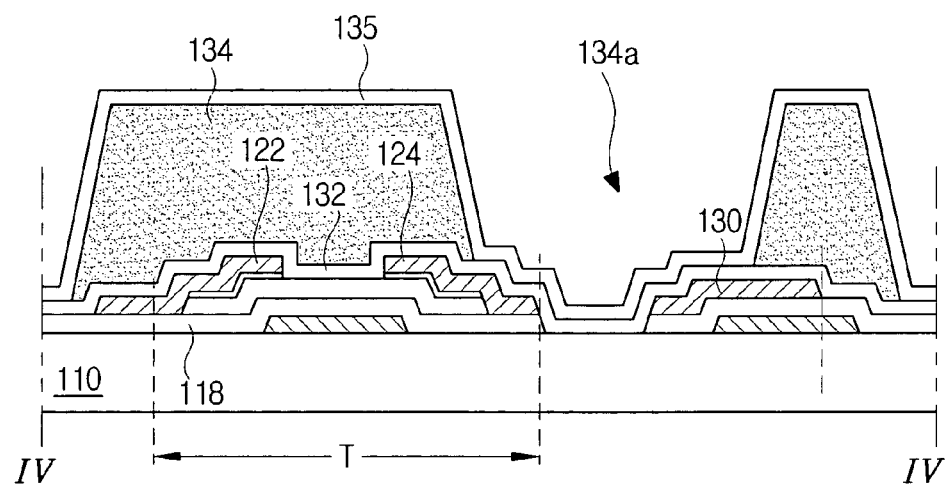
Figure 5E:
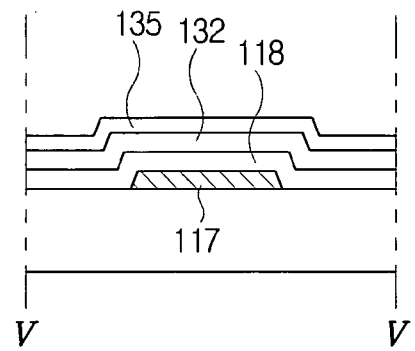
Figure 6E:
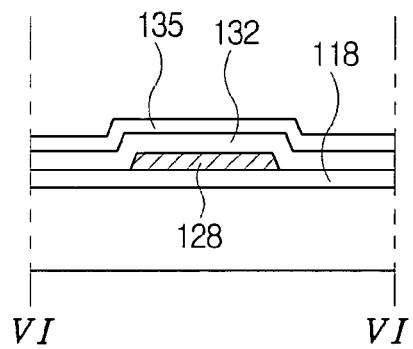

Referring to FIGS. 4E, 5E and 6E, a black matrix 134 is formed on the first passivation layer 132 by forming a light-blocking material and patterning the light blocking material through a mask process. Next, a second passivation layer 135 is formed on the entire surface of the substrate 110 including the black matrix 134 using a third insulating material. Except for the gate pad 117, the black matrix 134 covers the gate line 112, and except for the data pad 128, the black matrix 134 covers the data line 126. The black matrix also covers the thin film transistor T. The black matrix 134 has an opening 134a corresponding to a pixel area. The black matrix 134 can be made of an opaque organic material. The black matrix 134 not only blocks light but also protects the thin film transistor T. The opening 134*a* also exposes the first passivation layer 132 on portions of the drain electrode 124 and the second capacitor electrode 130.

To prevent oxidation of the black matrix 134, the second passivation layer 135 can be made of silicon nitride (SiNx) by a plasma enhanced chemical vapor deposition (PECVD) method that can form a thin film under low temperatures. In the alternative, the second passivation layer 135 can be made of one of silicon nitride (SiNx), silicon oxide (SiOx) and silicon oxynitride (SiOxNy) by a sputtering method. In another alternative, the second passivation layer 135 can be made of one of oxynitride (OxNy) and nitride (Nx) including carbon (C), which can be formed by the PECVD method using 3 MS(3-methoxy silane) as a precursor gas.

Figure 4F:
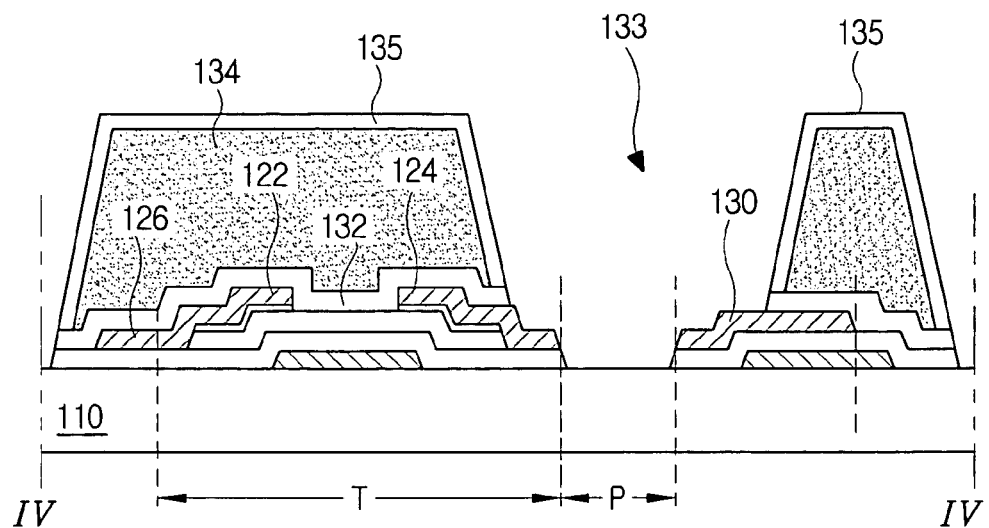
Figure 5F:
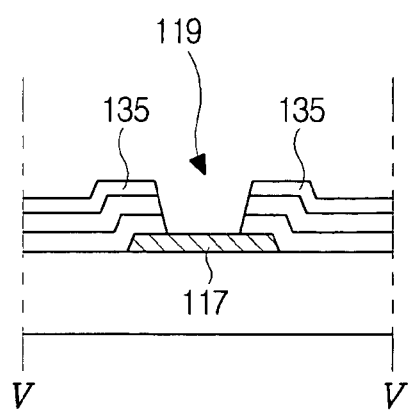
Figure 6F:
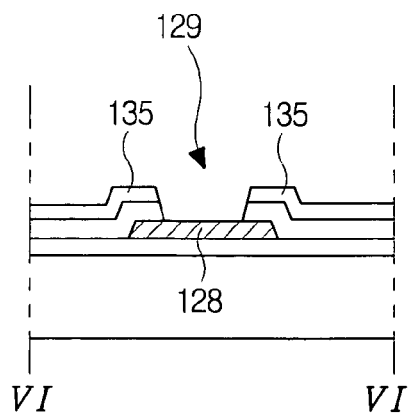

Referring to FIGS. 4F, 5F and 6F, an opening 133, a gate pad contact hole 119 and a data pad contact hole 129 are formed by patterning the second passivation layer 135, the first passivation layer 132 and the gate insulating layer 118 through a mask process. Here, portions of the drain electrode 124 and the second capacitor electrode 130 and the data pad 128 function as an etch mask, and thus, the gate insulating layer 118 under the portions of the drain electrode 124 and the second capacitor electrode 130 and the data pad 128 is not etched. The opening 133 exposes the substrate 110 and the portions of the drain electrode 124 and the second capacitor electrode 130 in the pixel area P. The gate pad contact hole 119 exposes the gate pad 117, and the data pad contact hole 129 exposes the data pad 128.

Figure 4G:
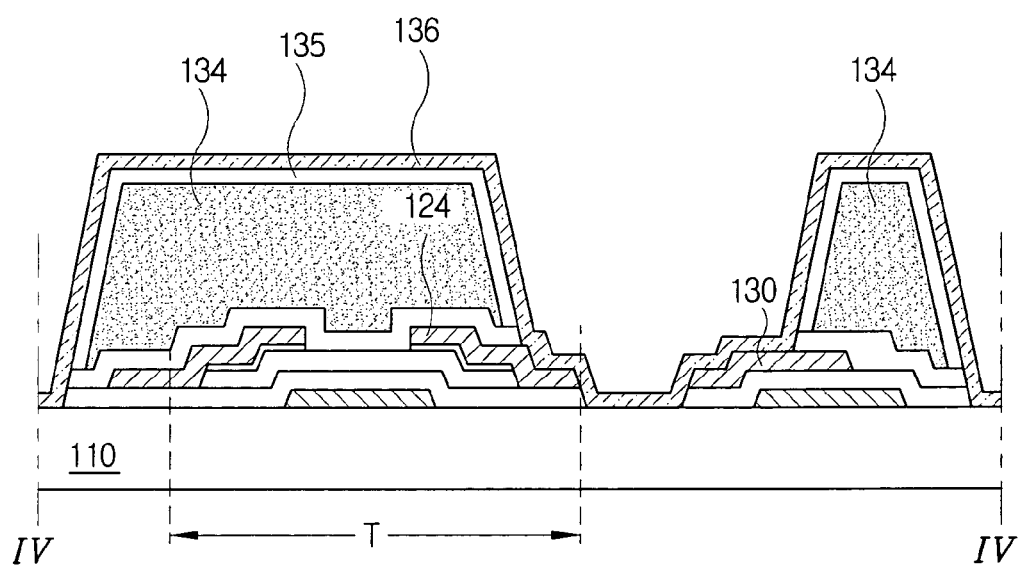
Figure 5G:
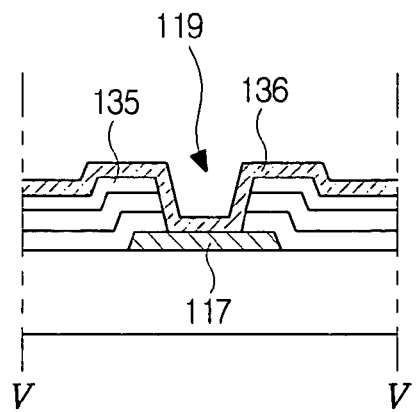
Figure 6G:
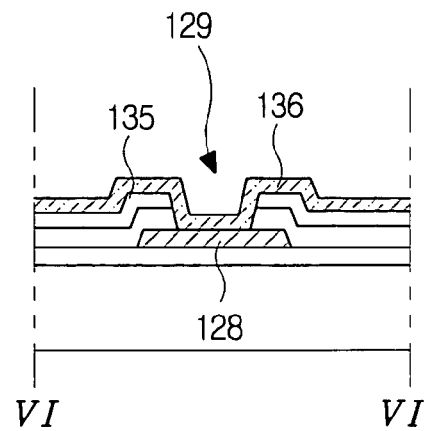

Referring to FIGS. 4G, 5G and 6G, a first transparent conductive layer 136 is formed over the entire surface of the substrate 110 including the second passivation layer 135 thereon. The first transparent conductive layer 136 may be formed of a transparent conductive material, such as indium tin oxide (ITO), indium zinc oxide (IZO) and indium tin zinc oxide (ITZO). The first transparent conductive layer 136 contacts the exposed portions of the drain electrode 124 and the second capacitor electrode 130. Moreover, the first transparent conductive layer 136 contacts the gate pad 117 through the gate pad contact hole 119 and contacts the data pad 128 through the data pad contact hole 129. Additionally, the first transparent conductive layer 136 also contacts the exposed substrate 110. Here, the first transparent conductive layer 136 is formed along sidewalls of the black matrix 134.

Figure 4H:
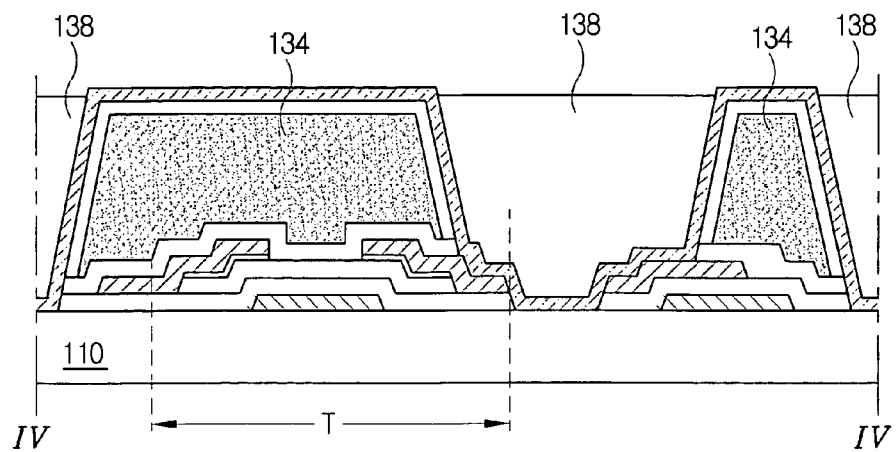
Figure 5H:
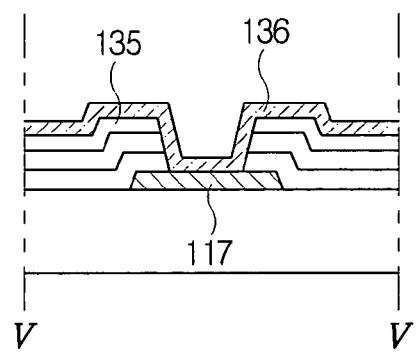
Figure 6H:
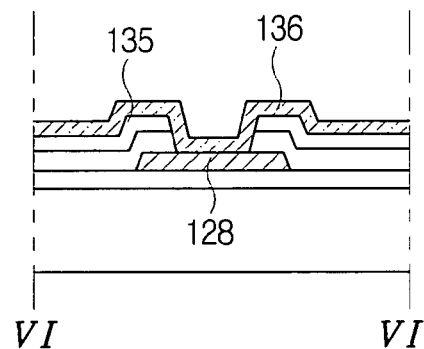

Referring to FIGS. 4H, 5H and 6H, a color filter layer 138 is formed on the first transparent conductive layer 136 in the opening 133 using a color resin. The color filter layer 138 includes three color filters of red, green and blue, and the black matrix 134 becomes a border between the color filters.

Figure 4I:
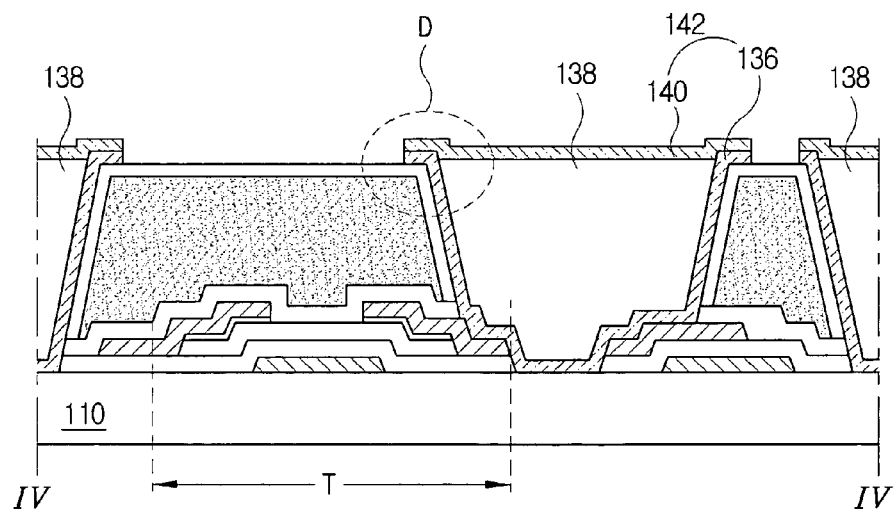
Figure 5I:
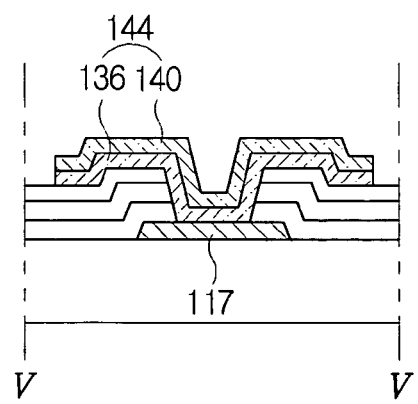
Figure 6I:
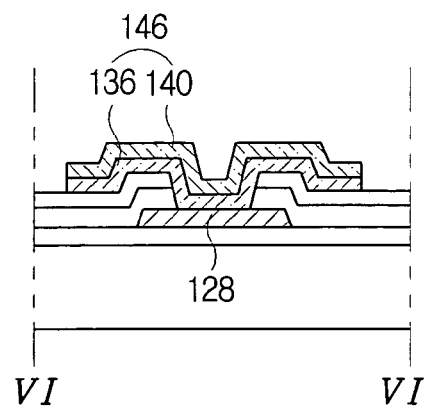

Referring to FIGS. 4I, 5I and 6I, a second transparent conductive layer 140 is formed on the color filter layer 138 and then patterned with the first transparent conductive layer 136 through a mask process to form a pixel electrode 142, a gate pad terminal 144 and a data pad terminal 146, each of which includes the first and second transparent conductive layers 136 and 140. The second transparent conductive layer 140 may be formed of a transparent conductive material, such as indium tin oxide (ITO), indium zinc oxide (IZO) or indium tin zinc oxide (ITZO). The pixel electrode 142 is disposed in the pixel area and is connected to the drain electrode 124 and the second capacitor electrode 130. The gate pad terminal 144 contacts the gate pad 117, and the data pad terminal 146 contacts the data pad 128.

Figure 7:
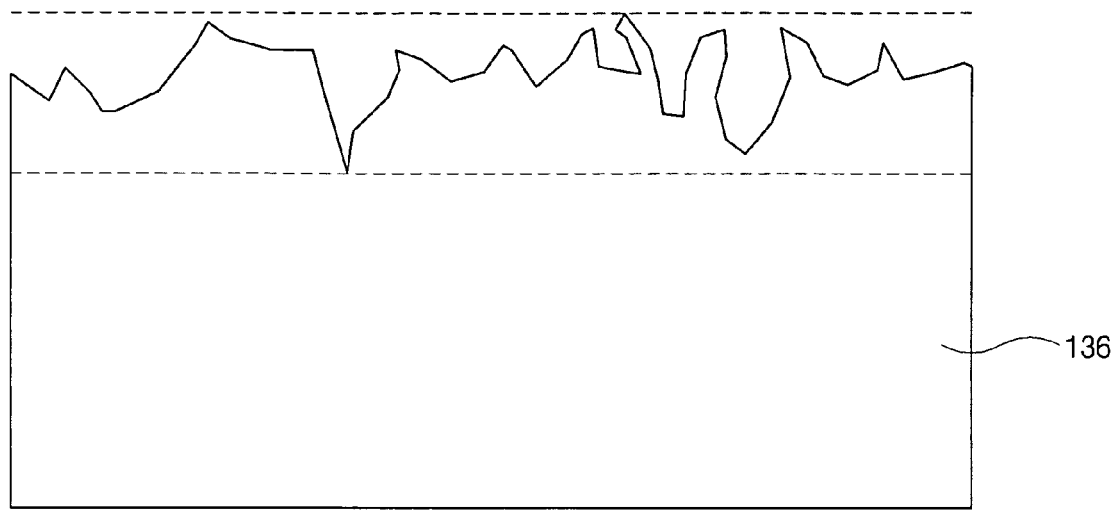
FIG. 7 is a schematic cross-sectional view of enlarging a first transparent conductive layer in accordance with the present invention.

FIG. 7 is a schematic cross-sectional view of enlarging a first transparent conductive layer of the present invention. In FIG. 7, a first transparent conductive layer 136 has a rough surface due to crevices, which are non-uniform with different depths. Thus, when a color filter layer is formed on the first transparent conductive layer 136, color resin remains within the crevices of the first transparent conductive layer 136. Next, a second transparent conductive layer is formed on the color filter layer and then is patterned with the first transparent conductive layer 136. At this time, the first and second transparent conductive layers poorly contact each other due to the color resin remaining within the crevices of the first transparent conductive layer 136 and the etchant used to etch the first and second transparent conductive layers may percolate between the first and second transparent conductive layers, thereby damaging the first and second transparent conductive layers and the color filter layer.

Figure 8:
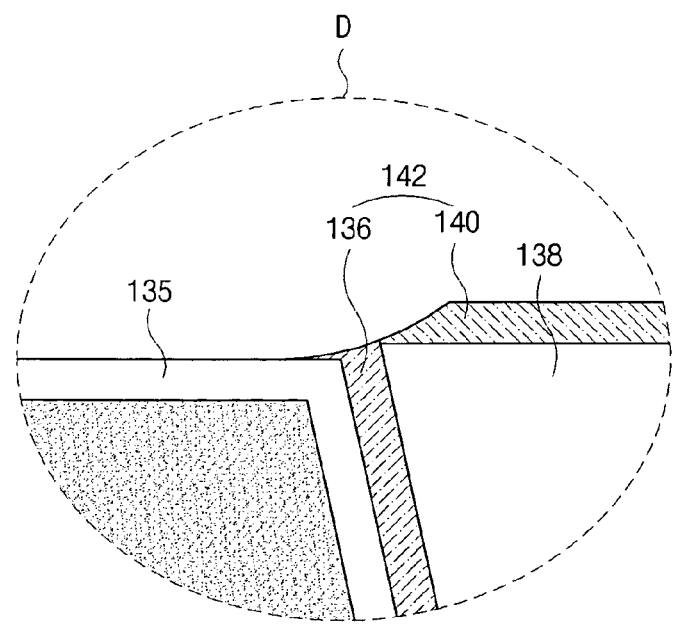
FIG. 8 is a cross-sectional view of enlarging the region D of FIG. 4I

FIG. 8 is a cross-sectional view of enlarging the region D of FIG. 4I. FIG. 8 shows the first and second transparent conductive layers 136 and 140 and the color filter layer 138 damaged by the etchant according to the color resin that remains within the crevices of the first transparent conductive layer 136. Thus, the first and second transparent conductive layers 136 may be poorly connected or disconnected to each other.

To solve the above problem, a surface of the first transparent conductive layer is partially etched, thereby removing the color resin remaining within the crevices of the first transparent conductive layer in a second exemplary embodiment of the present invention.

FIGS. 9A and 9B, FIGS. 10A and 10B, and FIGS. 11A and 11B are cross-sectional views illustrating process steps of manufacturing an array substrate according to a second embodiment of the present invention and uses some of the same steps as discussed in reference to FIGS. 4A to 4H, FIGS. 5A to 5H and FIGS. 6A to 6H. Thus, explanation for the steps that are also used in FIGS. 4A to 4H, FIGS. 5A to 5H and FIGS. 6A to 6H will be omitted. Wherever possible, the same reference numbers will be used throughout the drawings to refer to the same or like parts.

Figure 9A:
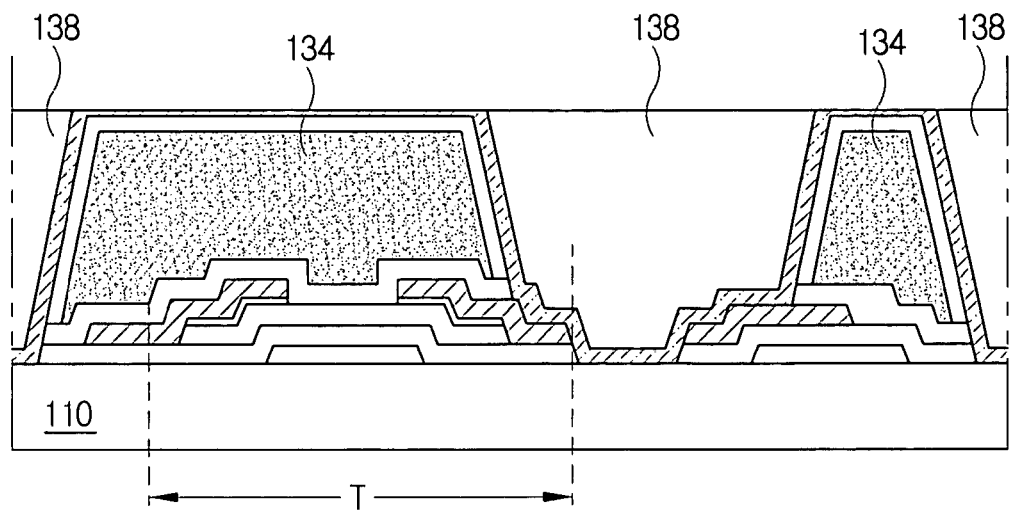
FIGS. 9A and 9B, FIGS. 10A and 10B, and FIGS. 11A and 11B are cross-sectional views illustrating process steps of manufacturing an array substrate according to a second exemplary embodiment of the presenting invention.
Figure 10A:
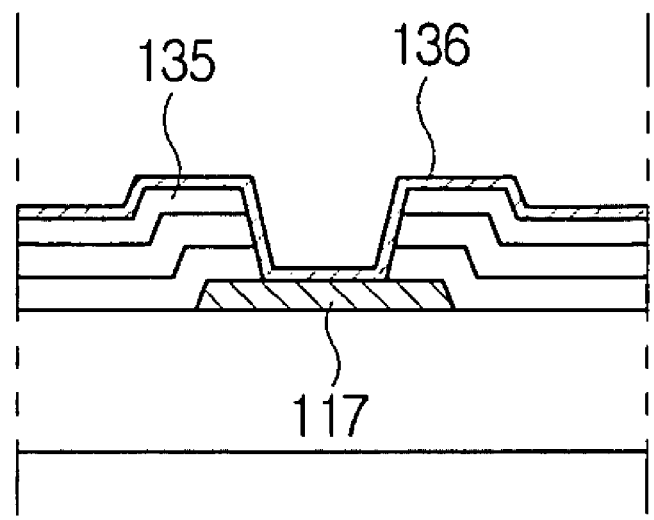
Figure 11A:
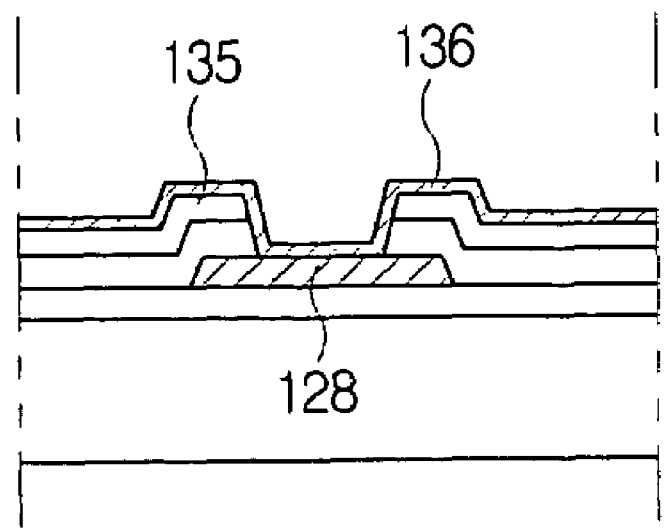

Referring to FIGS. 9A, 10A and 11A, after the color filter layer 138 is formed on the first transparent conductive layer 136 in the opening 133, a top surface of the first transparent conductive layer 136 is partially etched. At this time, either a dry etching method or a wet etching may be used. Here, the transparent conductive layer 136 under the color filter layer 138 is not etched while the transparent conductive layer 136 uncovered by the color filter layer 138 is partially etched. The first transparent conductive layer 136, beneficially, may be etched more than an average surface roughness. The average surface roughness corresponds to a root mean square of depths of the crevices.

The first transparent conductive layer 136 may have a thickness within a range of about 450 Å to about 550 Å. For example, if the average surface roughness of the first transparent conductive layer is about 15 Å, an etching depth may be more than 15 Å. At this time, the color filter layer 138 functions as an etching mask.

Figure 9B:
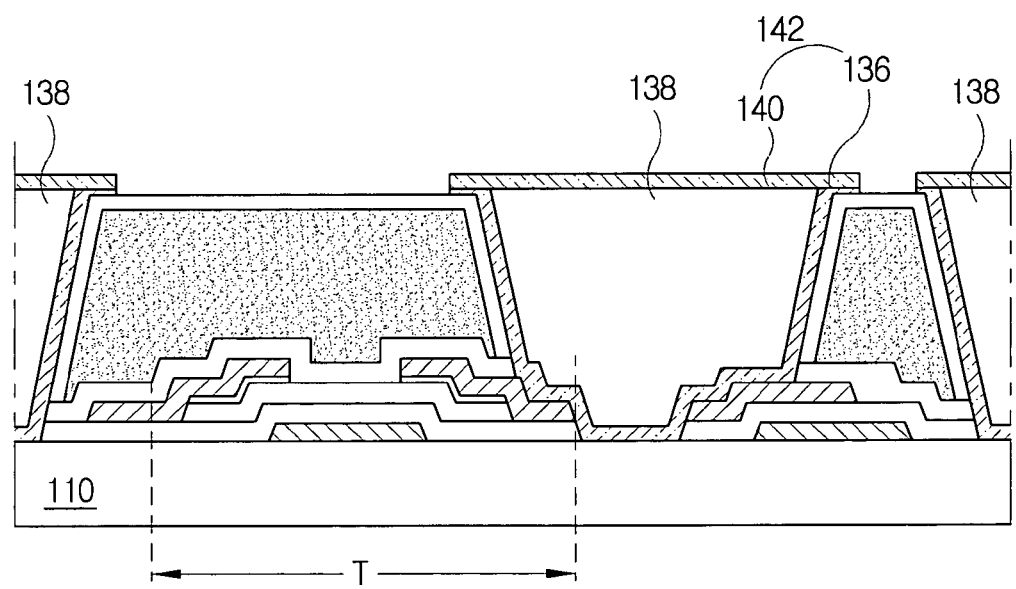
Figure 10B:
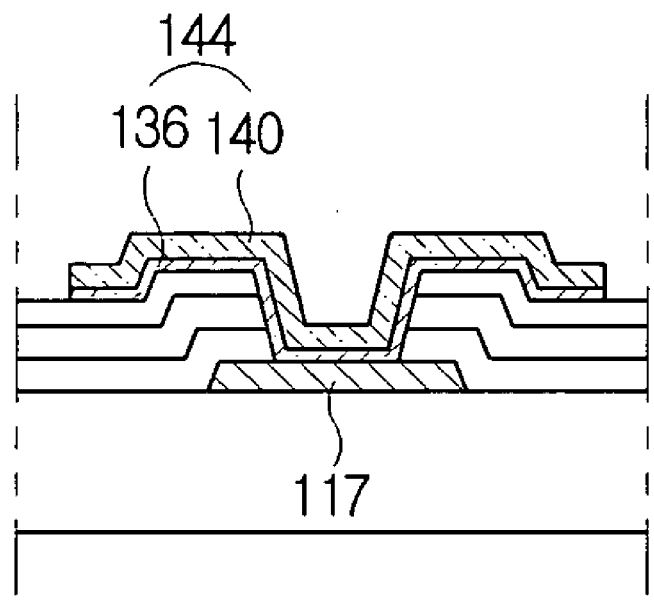
Figure 11B:
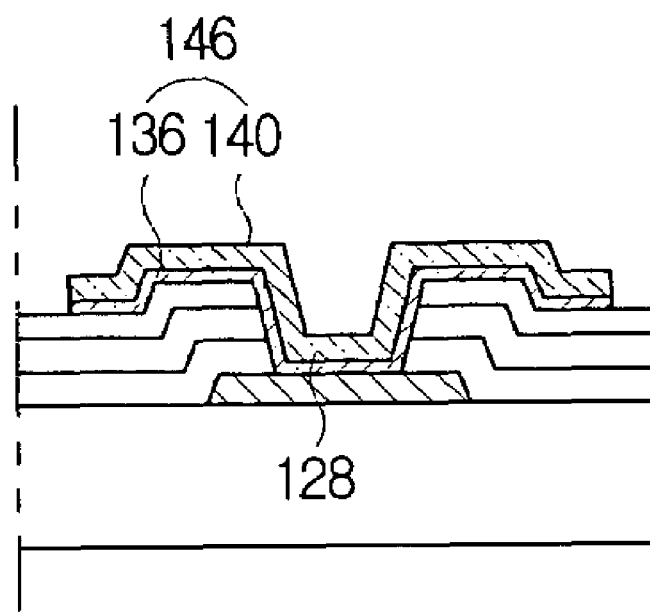

Referring to FIGS. 9B, 10B and 11B, a second transparent conductive layer 140 is formed on the color filter layer 138 and then patterned with the first transparent conductive layer 136 to form a pixel electrode 142, a gate pad terminal 144 and a data pad terminal 146, each of which includes the first and second transparent conductive layers 136 and 140.

A portion of the first transparent conductive layer 136 contacting the second transparent conductive layer 140 is thinner than a portion of the first transparent conductive layer 136 under the color filter layer 138. A difference between thicknesses of the portion of the first transparent conductive layer 136 contacting the second transparent conductive layer 140 and the portion of the first transparent conductive layer 136 under the color filter layer 138 may be equal to or more than the average surface roughness of the first transparent conductive layer 136.

Here, if a reflector is formed in place of the first transparent conductive layer, the LCD device can be used as a reflective type. The reflector may be formed of a metal material that reflects light well, such as aluminum (Al), molybdenum (Mo) or chromium (Cr).

In accordance with the present invention, the black matrix, the color filter layer and the array elements are formed on the same substrate so that the liquid crystal display device can have a high aperture ratio by minimizing the alignment margin. Further, the surface of the first transparent conductive layer is partially etched, and the color resin on the first transparent conductive layer is removed, thereby improving contact between the first and second transparent conductive layers. Thus, damage of the first and second transparent conductive layers and the color filter layer are prevented, and the first and second transparent conductive layers are well patterned. Additionally, since the pixel electrode has a double-layered structure, the process stability is improved during the fabricating process of the array substrate.

It will be apparent to those skilled in the art that various modifications and variations can be made in the liquid crystal display device having an array substrate of a thin film transistor structure and a manufacturing method thereof of the present invention without departing from the spirit or scope of the invention. Thus, it is intended that the present invention cover the modifications and variations of this invention provided they come within the scope of the appended claims and their equivalents.

What is claimed is:

1. A manufacturing method of a liquid crystal display device, comprising:
    forming a gate line and a data line on a substrate;
    forming a thin film transistor connected to the gate and data lines, the thin film transistor including a gate electrode, a semiconductor layer, a source electrode and a drain electrode;
    forming a black matrix over the thin film transistor, the black matrix having an opening;
    forming a first conductive layer on a substrate having the black matrix such that the first conductive layer contacts a portion of the drain electrode;
    forming a color filter layer on the first conductive layer at a portion corresponding to the opening of the black matrix;
    partially etching a surface of the first conductive layer corresponding to the black matrix;
    forming a second conductive layer on the color filter layer such that the second conductive layer contacts the partially etched first conductive layer; and
    forming a pixel electrode by patterning the first and second conductive layers.

2. The method according to claim 1, wherein the first conductive layer includes one of indium tin oxide (ITO), indium zinc oxide (IZO), indium tin zinc oxide (ITZO), aluminum, chromium, and molybdenum.

3. The method according to claim 1, wherein the second conductive layer includes a transparent conductive material.

4. The method according to claim 1, further comprising forming a first passivation layer between the thin film transistor and the black matrix.

5. The method according to claim 4, further comprising forming a second passivation layer between the black matrix and the first conductive layer.

6. The method according to claim 1, wherein a portion of the partially etched first conductive layer contacting the second conductive layer is thinner than a portion of the first conductive layer under the color filter layer.

7. The method according to claim 6, wherein a difference between thicknesses of the portion of the partially etched first conductive layer contacting the second conductive layer and the portion of the first conductive layer under the color filter layer is equal to or more than an average surface roughness of the first conductive layer.

8. A manufacturing method of a liquid crystal display device, comprising:
    forming a gate line and a gate electrode on a substrate;
    forming a gate insulating layer on the gate line and the gate electrode;
    forming a semiconductor layer on the gate insulating layer over the gate electrode;
    forming a data line, a source electrode and a drain electrode, the data line crossing the gate line to define a pixel area, and the source and drain electrodes being disposed over the semiconductor layer and being spaced apart from each other, and the gate electrode, the semiconductor layer, the source electrode, and the drain electrodes form a thin film transistor;
    forming a first passivation layer covering the thin film transistor;
    forming a black matrix on the first passivation layer, the black matrix having a first opening corresponding to the pixel area and the first opening exposes the first passivation layer on a portion of the drain electrode;
    forming a second passivation layer on a surface of the substrate having the black matrix;
    forming a second opening by patterning the second passivation layer, the first passivation layer, and the gate insulating layer such that the second opening exposes a portion of the drain electrode;
    forming a first conductive layer on the second passivation layer such that the first conductive layer contacts a portion of the drain electrode;
    forming a color filter layer on the first conductive layer in the second opening;
    partially etching a surface of the first conductive layer over the black matrix;
    forming a second conductive layer on the color filter layer such that the second conductive layer contacts the partially etched the first conductive layer; and
    forming a pixel electrode by patterning the first and second conductive layers, the pixel electrode being disposed in the pixel area.

9. The method according to claim 8, wherein a portion of the partially etched first conductive layer contacting the second conductive layer is thinner than a portion of the first conductive layer under the color filter layer.

10. The method according to claim 9, wherein a difference between thicknesses of the portion of the partially etched first conductive layer contacting the second conductive layer and the portion of the first conductive layer under the color filter layer is equal to or more than an average surface roughness of the first conductive layer.

11. A liquid crystal display device, comprising:
    a substrate;
    a gate line and a data line disposed on the substrate crossing each other to define a pixel area;

a thin film transistor disposed near the crossing of the gate line and the data line, the thin film transistor having a gate electrode, a semiconductor layer, a source electrode and a drain electrode;

a black matrix disposed on the thin film transistor and having an opening;

a first pixel electrode disposed on the black matrix and in the pixel area, the first pixel electrode contacting a portion of the drain electrode;

a color filter layer disposed on the first pixel electrode in the pixel area; and a second pixel electrode on the color filter layer contacting the first pixel electrode, a portion of the first pixel electrode contacting the second pixel electrode being thinner than a portion of the first pixel electrode under the color filter layer.

12. The device according to claim 11, wherein the first pixel electrode includes one of indium tin oxide (ITO), indium zinc oxide (IZO), indium tin zinc oxide (ITZO) aluminum, chromium, and molybdenum.

13. The device according to claim 11, wherein the second pixel electrode includes a transparent conductive material.

14. The device according to claim 11, further comprising a first passivation layer between the thin film transistor and the black matrix.

15. The device according to claim 14, further comprising a second passivation layer between the black matrix and the first pixel electrode.

16. The device according to claim 11, wherein a difference between thicknesses of the portion of the first pixel electrode contacting the second pixel electrode and the portion of the first pixel electrode under the color filter layer is equal to or more than an average surface roughness of the first pixel electrode.

* * * * *